(12) United States Patent
Wang

(10) Patent No.: US 7,667,983 B2
(45) Date of Patent: Feb. 23, 2010

(54) ELECTRONIC TRANSMISSION PORT COVER ASSEMBLY

(75) Inventor: Ting-Hsien Wang, Shulin (TW)

(73) Assignee: Shin Zu Shing Co., Ltd., Shulin, Taipei Hsien (TW)

( * ) Notice: Subject to any disclaimer, the term of this patent is extended or adjusted under 35 U.S.C. 154(b) by 508 days.

(21) Appl. No.: 11/556,157

(22) Filed: Nov. 2, 2006

(65) Prior Publication Data

US 2008/0123257 A1 May 29, 2008

(51) Int. Cl.
*H05K 7/02* (2006.01)
(52) U.S. Cl. ............ 361/807; 361/683; 361/686; 361/752; 361/756
(58) Field of Classification Search ............ 361/807, 361/683, 686, 752, 756
See application file for complete search history.

(56) References Cited

U.S. PATENT DOCUMENTS

| | | | | |
|---|---|---|---|---|
| 5,239,427 A | * | 8/1993 | Ooka et al. | 360/71 |
| 5,274,523 A | * | 12/1993 | Tomita et al. | 360/96.51 |
| 5,329,410 A | * | 7/1994 | Iwamoto | 360/94 |
| 5,841,632 A | * | 11/1998 | Horii et al. | 361/679.43 |
| 5,917,675 A | * | 6/1999 | Yang | 360/96.51 |
| 6,377,451 B1 | * | 4/2002 | Furuya | 361/679.32 |
| 7,017,232 B1 | * | 3/2006 | Priddy | 16/286 |
| 7,084,345 B1 | * | 8/2006 | Chen et al. | 174/545 |

* cited by examiner

*Primary Examiner*—Jinhee J Lee
*Assistant Examiner*—Xiaoliang Chen
(74) *Attorney, Agent, or Firm*—pattenttm.us

(57) ABSTRACT

An electronic transmission port cover assembly has a body, a sliding bracket and a cover. The body is mounted securely in an electronic device adjacent to an electronic transmission port. The sliding bracket is mounted slidably on the body. The cover is attached pivotally to the sliding bracket and has cover springs. The sliding bracket is pushed relative to the body and the cover is pushed away from the body and pivots relative to the sliding bracket to uncover the transmission port.

3 Claims, 8 Drawing Sheets

ELECTRONIC TRANSMISSION PORT COVER ASSEMBLY

BACKGROUND OF THE INVENTION

1. Field of the Invention

The present invention relates to a cover assembly, and more particularly to a cover assembly for electronic transmission ports.

2. Description of Related Art

Use of electronic devices, particularly portable electronic devices, is becoming much more prevalent. Most electronic devices have electronic transmission ports that allow similar or complementary electronic devices to be connected to each other. The electronic transmission ports especially on portable electronic devices are exposed to the environment and are susceptible to accumulation of airborne dirt and grime.

Modern portable electronic devices such as notebook computers, PDAs and the like are small and thin so people can carry them conveniently. However, in hostile environments, electronic transmission ports on the electronic devices are easily contaminated and coated with dust and grime or damaged by foreign matter.

To overcome the problems, caps have been designed to mount on and protect electronic transmission ports. However, the caps are often mislaid or lost when the electronic transmission ports are connected to other electronic devices.

To overcome the shortcomings, the present invention provides an electronic transmission port cover assembly to obviate or mitigate the aforementioned problems.

SUMMARY OF THE INVENTION

The main objective of the present invention is to provide an electronic transmission port cover assembly that protects an electronic transmission port, is convenient to use and will not be lost.

To achieve the objectives, the electronic transmission port cover assembly in accordance with the present invention comprises a body, a sliding bracket and a cap.

The body is mounted securely in an electronic device adjacent to an electronic transmission port.

The sliding bracket is mounted slidably on the body.

The cover is connected pivotally to the sliding bracket, corresponds to and selectively covers the electronic transmission port adjacent to the body and has multiple cover springs.

If the transmission port covered by the cover needs to be used, the sliding bracket is pushed relative to the body, and the cover is pushed away from the body and pivots relative to the sliding bracket to uncover the transmission port.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
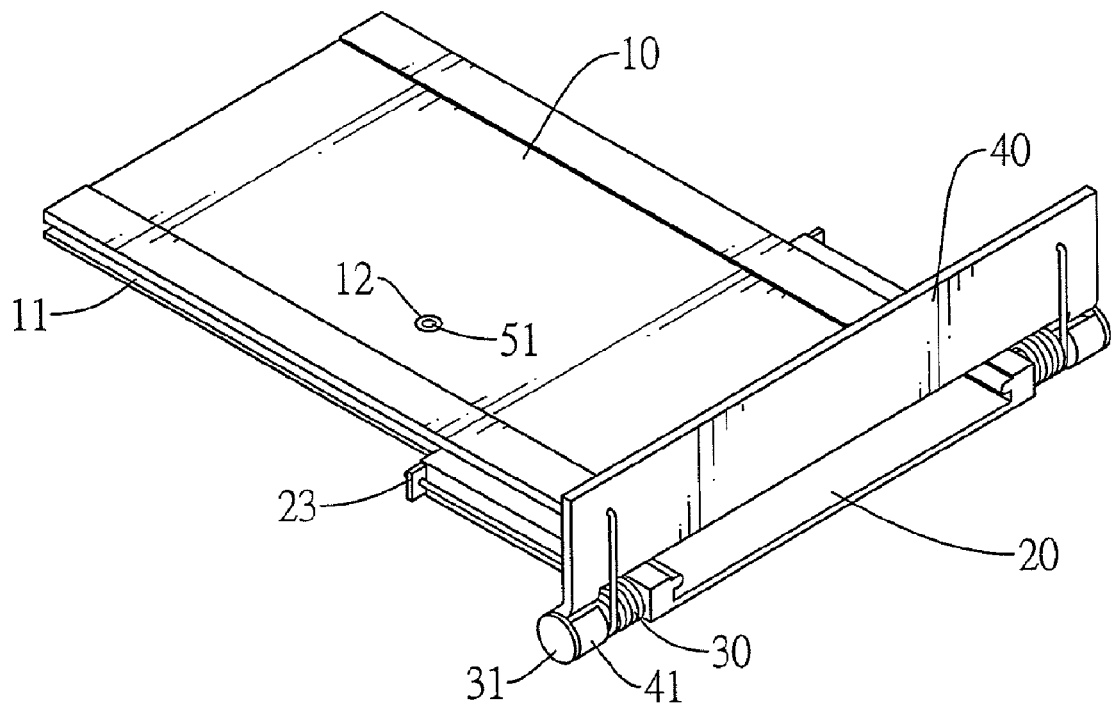
FIG. 1 is a perspective view of an electronic transmission port cover assembly in accordance with the present invention.
Figure 2:
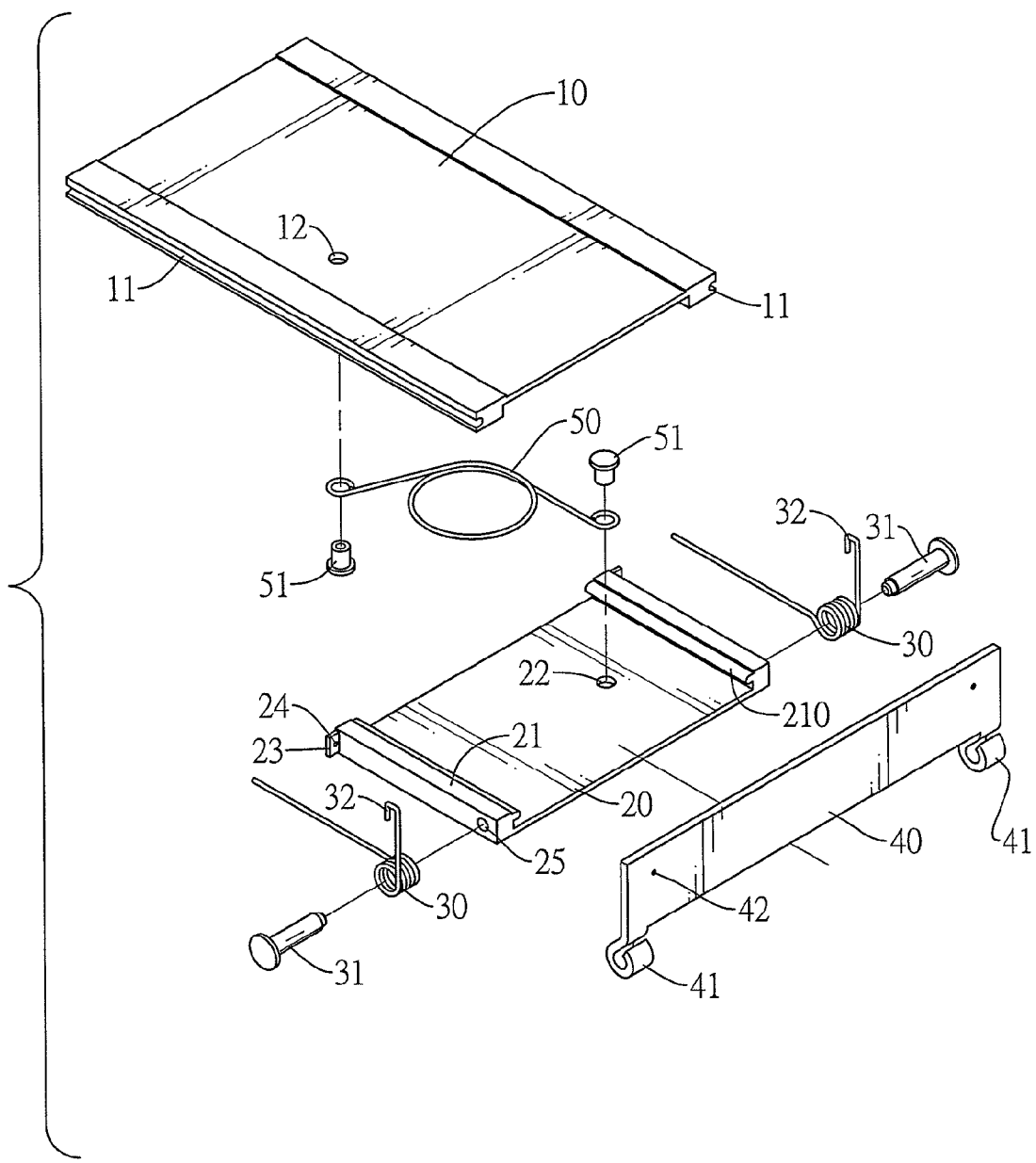
FIG. 2 is an exploded perspective view of the cover assembly in FIG. 1.
Figure 8:
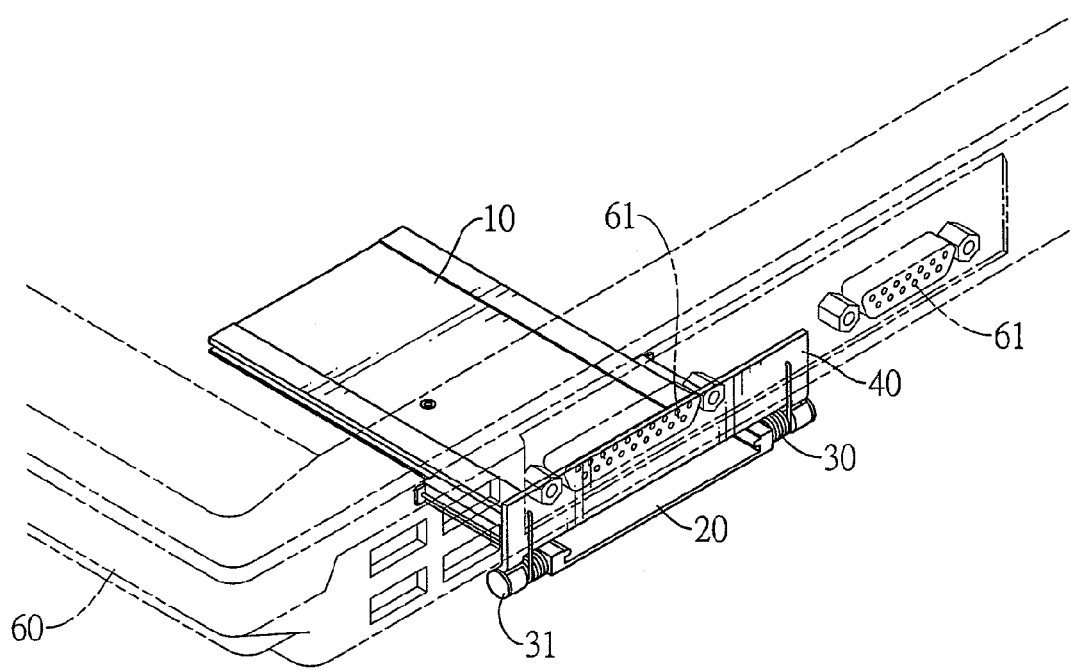
FIG. 8 is an operational perspective view of the cover assembly in FIG. 1 mounted in a notebook.

With reference to FIGS. 1, 2 and 8, an electronic transmission port cover assembly in accordance with the present invention is mounted on a computer (60) having at least one transmission port (61), protects the computer transmission port (61) and comprises a body (10), a sliding bracket (20), an optional bracket spring (50) and a cover (40).

The body (10) is mounted securely in the computer (60), has two sides, a bottom and an optional first mounting hole (12) and may have two slots (11). The first mounting hole (12) is formed through the body (10) near one of the sides. The slots (11) are formed longitudinally respectively along the sides of the body (10).

The sliding bracket (20) is mounted slidably on the bottom of the body (10) and comprises two sides, two rails (21) and an optional second mounting hole (22). The rails (21) are formed longitudinally and respectively along the sides of the sliding bracket (20) and mounted slidably and respectively on the sides of the body (10), and each rail (21) has a rear end, a front end, an inner side surface, an optional rib (210), a mounting tab (23) and a hole (25). The rib (210) is formed longitudinally on the inner side surface of the rail (21) and is mounted slidably in the corresponding slot (11) in the body (10). The mounting tab (23) is formed on and extends perpendicularly out from the rear end of the rail (21) and has a through hole (24) formed through the mounting tab (23). The hole (25) is formed transversely through the rail (21) near the front end of the rail (21). The second mounting hole (22) is formed through the sliding bracket (20) near the side of the sliding bracket (20) far away from the first mounting hole (12).

Figure 3:
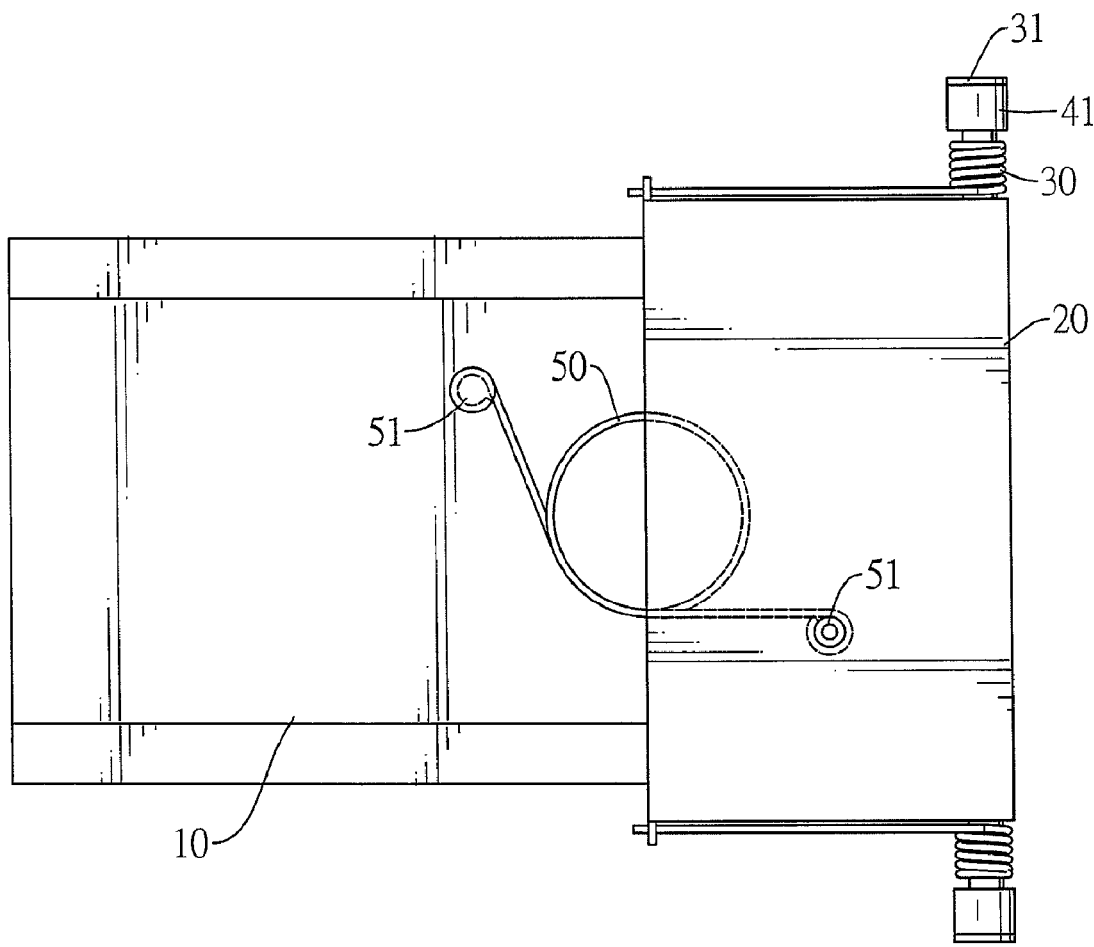
FIG. 3 is a bottom view of the cover assembly in FIG. 1 with internal elements shown in phantom lines.
Figure 6:
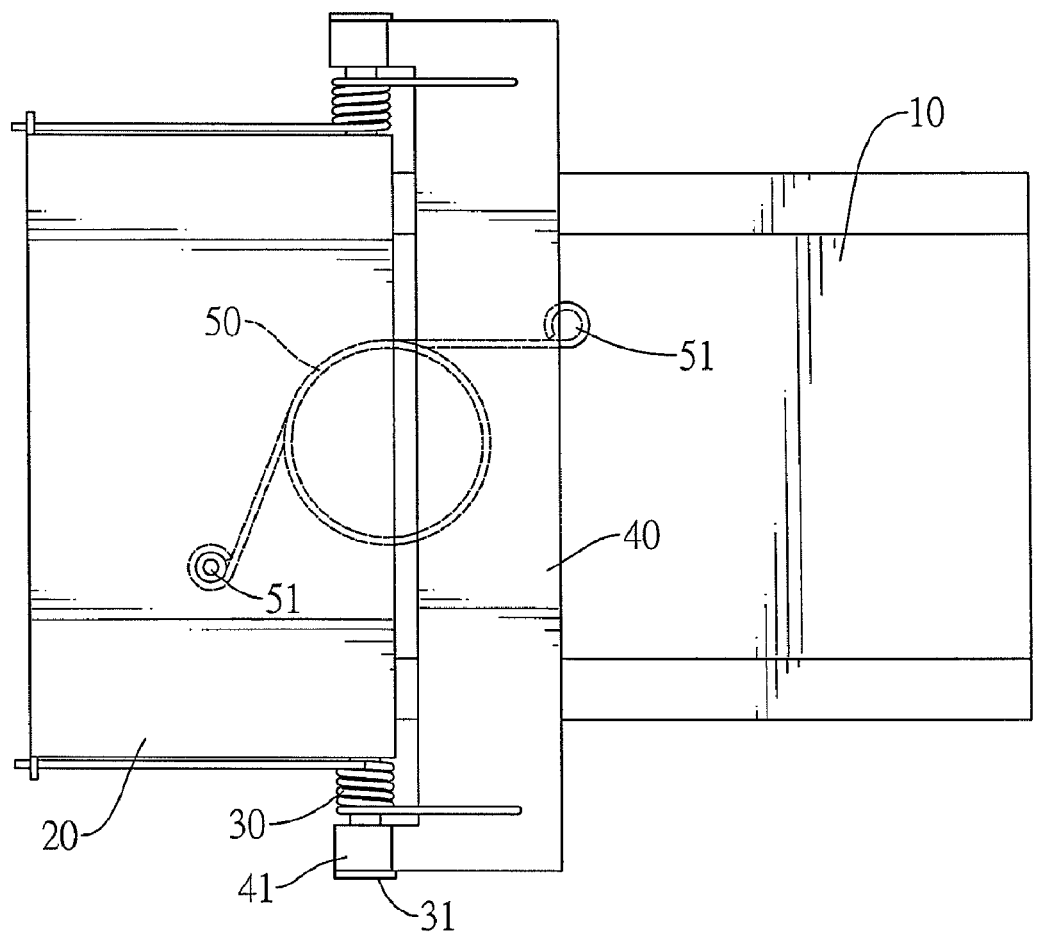
FIG. 6 is an operational bottom view of the cover assembly in FIG. 1 with internal elements shown in phantom lines.

With further reference to FIGS. 3 and 6, the bracket spring (50) is mounted between the body (10) and the sliding bracket (20), selectively positions the sliding bracket (20) flush with the front end and the rear end of the body (10) and has a first end, a second end and two fasteners (51). The first end may be formed as a circle and corresponds to the first mounting hole (12). The second end may be formed as a circle and corresponds to the second mounting hole (22). The fasteners (51) may be mounted respectively through the first end and the second end of the bracket spring (50) and attach the first end and the second end of the bracket spring (50) securely and respectively to the first mounting hole (12) and the second mounting hole (22).

Figure 4:
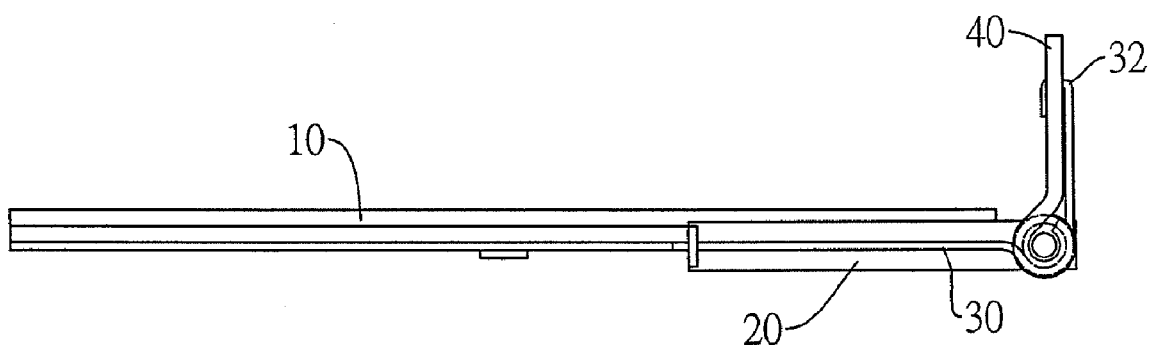
FIG. 4 is a side view of the cover assembly in FIG. 1 with internal elements shown in phantom lines.

With further reference to FIG. 4, the cover (40) is connected pivotally to the sliding bracket (20), selectively covers the corresponding transmission port (61) of the computer (60) and has a bottom, a front surface, two ends, two hinge barrels (41), two spring holes (42), two cover springs (30) and two pivot pins (31). The hinge barrels (41) are formed on and protrude longitudinally from the bottom of the cover (40) respectively at the ends and correspond respectively to the holes (25) in the rails (21) on the sliding bracket (20). The spring holes (42) are formed through the cover (40) respectively near the ends of the cover (40). The cover springs (30) resiliently hold the cover (40) perpendicular to the sliding bracket (20) to cover the transmission port (61) and are mounted adjacent respectively to the ends of the cover (40) at the hinge barrels (41), and each cover spring (30) has a stationary end (33), an actuating end (32) and a hole. The stationary ends (33) are mounted securely respectively in the through holes (24) in the mounting tabs (23). The actuating ends (32) mounted securely respectively in the spring holes (42) and abut the front surface of the cover (40). The hole is formed in the cover spring (30) between the stationary end (33) and the actuating end (32). The holes correspond respectively to and align with the holes (25) in the rails (21) on the sliding bracket (20). The pivot pins (31) are mounted respectively through the hinge barrels (41) on the cover (40) and respectively through the holes in the cover springs (30) and are secured respectively in the pin holes (25) in the rails (21) on the sliding bracket (20) to attach the cover (40) pivotally to the sliding bracket (20) and to hold the cover springs (30) in position relative to the sliding bracket (20).

Figure 5:
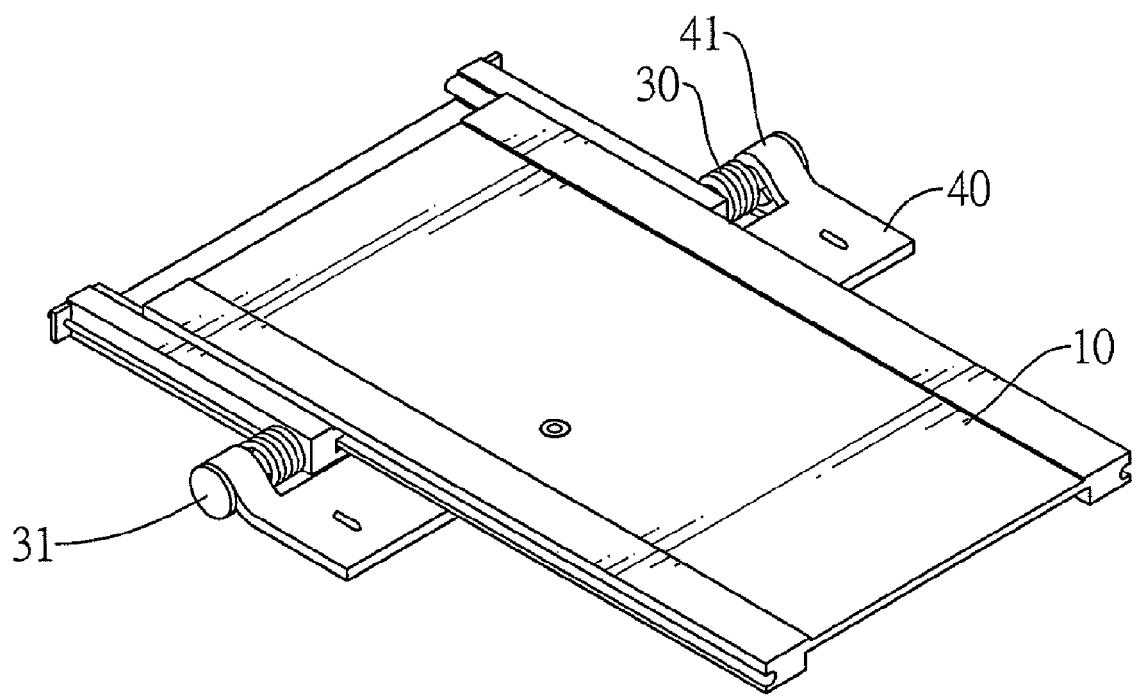
FIG. 5 is an operational perspective view of the cover assembly in FIG. 1.
Figure 7:
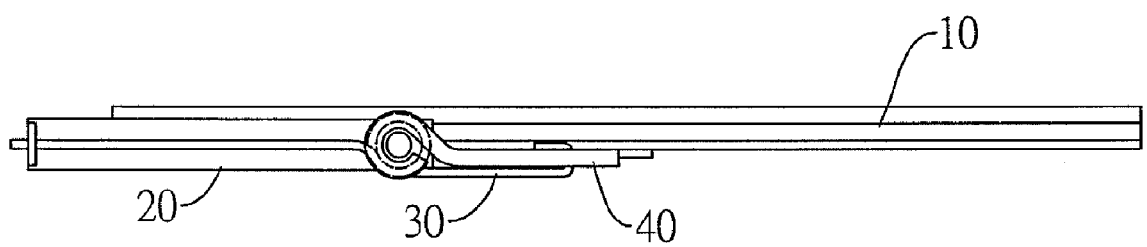
FIG. 7 is an operational side view of the cover assembly in FIG. 1 with internal elements shown in phantom lines.

With further reference to FIGS. 5 and 7, uncovering the transmission port (61) is quickly accomplished by simply pushing the sliding bracket (20) relative to the body (10) from the front end to the rear end of the body (10). When the sliding bracket (20) begins to slide, the body (10) presses against and pivots the cover (40) parallel to the body (10) and the sliding bracket (20). When the sliding bracket (20) reaches the rear end of the body (10), the transmission port (61) is completely uncovered and ready for use.

Even though numerous characteristics and advantages of the present invention have been set forth in the foregoing description together with details of the structure and function of the invention, the disclosure is illustrative only. Changes may be made in detail especially in matters of shape, size and arrangement of parts within the principles of the invention to the full extent indicated by the broad general meaning of the terms in which the appended claims are expressed.

What is claimed is:

1. An electronic transmission port cover assembly comprising
    a body having
        two sides; and
        a bottom;
    a sliding bracket being mounted slidably on the bottom of the body and comprising
        two sides; and
        two rails slidably being formed longitudinally and respectively along the sides of the sliding bracket and mounted slidably and respectively on the sides of the body, and each rail having
            a rear end;
            a front end;
            an inner side surface;
            a mounting tab being formed on and extending from the rear end of the rail and having a through hole formed through the mounting tab; and
            a hole formed transversely through the rail near the front end of the rail; and
    a cover being connected pivotally to the sliding bracket and having
        a bottom;
        a front surface;
        two ends;
        two hinge barrels formed on and protruding longitudinally from the bottom of the cover respectively at the ends and corresponding respectively to the holes in rails on the sliding bracket;
        two spring holes being formed through the cover respectively near the ends of the cover;
        two cover springs resiliently holding the cover perpendicular to the sliding bracket, being mounted adjacent respectively to the ends of the cover, and each cover spring having
            a stationary end being mounted securely in the through hole in a corresponding one of the mounting tabs;
            an actuating end being mounted securely in one of the spring holes and abutting the front surface of the cover; and
            a hole formed in the cover spring between the stationary end and the actuating end of the cover spring, and the holes corresponding respectively to and aligning with the holes in the rails on the sliding bracket; and
        two pivot pins mounted respectively through the hinge barrels on the cover and respectively through the holes in the cover springs and secured respectively in the holes in the rails on the sliding bracket.

2. The cover assembly as claimed in claim 1, wherein
the body further has a first mounting hole formed through the body near one of the sides;
the sliding bracket further has a second mounting hole formed through the sliding bracket near the side of the sliding bracket far away from the first mounting hole; and
the cover assembly further has a bracket spring mounted between the body and the sliding bracket, selectively positioning the sliding bracket flush with the front end and the rear end of the body and having
    a first end corresponding to the first mounting hole;
    a second end corresponding to the second mounting hole; and
    two fasteners attaching the first end and the second end of the bracket spring securely and respectively to the first mounting hole and the second mounting hole.

3. The cover assembly as claimed in claim 2, wherein
the body further has two slots formed longitudinally respectively along the sides of the body; and
each rail on the sliding bracket further has a rib formed longitudinally on the inner side surface of the rail and mounted slidably in the corresponding slot in the body.

* * * * *